United States Patent [19]

Dingwall et al.

[11] Patent Number: 5,291,198
[45] Date of Patent: Mar. 1, 1994

[54] AVERAGING FLASH ANALOG-TO-DIGITAL CONVERTER

[75] Inventors: Andrew G. F. Dingwall, Princeton; Fu-Lung Hsueh, Plainsboro, both of N.J.

[73] Assignees: David Sarnoff Research Center Inc., Princeton, N.J.; Industrial Technology Research Institute; Electronics Research & Service Org., China

[21] Appl. No.: 887,761

[22] Filed: May 29, 1992

[30] Foreign Application Priority Data

Mar. 16, 1992 [GB] United Kingdom ............... 9205727

[51] Int. Cl.5 ............................................ H03M 1/36
[52] U.S. Cl. ..................................... 341/159; 341/156
[58] Field of Search ............... 341/155, 156, 158, 159, 341/160

[56] References Cited

U.S. PATENT DOCUMENTS

| | | | |
|---|---|---|---|
| 4,058,806 | 11/1977 | Nadler | 341/159 |
| 4,275,386 | 6/1981 | Michel | 340/347 |
| 4,386,339 | 5/1983 | Henry et al. | 340/347 AD |
| 4,608,555 | 8/1986 | Hoeft | 340/347 |
| 4,660,166 | 4/1987 | Hopfield | 364/807 |
| 4,719,591 | 1/1988 | Hopfield et al. | 364/807 |
| 4,737,766 | 4/1988 | van de Plassche | 341/159 |
| 4,769,628 | 9/1988 | Hellerman | 341/162 |
| 4,831,379 | 5/1989 | van de Plassche | 341/156 |
| 4,897,656 | 1/1990 | van de Plassche et al. | 341/159 |
| 4,924,227 | 5/1990 | Mangelsdorf | 341/159 |
| 4,928,103 | 5/1990 | Lane | 341/159 |
| 4,965,579 | 11/1990 | Liu et al. | 341/159 |
| 4,983,973 | 1/1991 | Lewyn | 341/138 |
| 5,023,613 | 6/1991 | Dingwall | 341/118 |
| 5,081,454 | 1/1992 | Campbell, Jr. et al. | 341/141 |
| 5,157,397 | 10/1992 | Vernon | 341/159 |
| 5,164,728 | 11/1992 | Matsuzawa et al. | 341/159 |

Primary Examiner—Howard L. Williams
Attorney, Agent, or Firm—William J. Burke

[57] ABSTRACT

A flash-type analog-to-digital converter (ADC) uses only $2^{n-m}$ comparators coupled to the analog input line to generate a n-bit digital output signal. Each pair of these actual comparators are coupled, in parallel, to $2^m$ pseudocomparators which provide values representing comparisons of the input signal value to respective reference values between the reference values used by the actual comparators. The output signals of each pair of actual comparators are combined in respectively different proportions at each of the pseudocomparators. In this manner, the output signals of the actual comparators are averaged to produce the interstitial comparison values. In one embodiment of the invention, the ADC is implemented in BiCMOS technology with a bipolar differential input stage and a CMOS latching comparator. Signals are distributed from the actual comparators to the pseudocomparators via a pair of resistive ladder networks. In other embodiments of the invention the ADC is implemented in CMOS technology and the pseudocomparators use ratioed transistor widths and ratioed capacitors to proportionally divide the output signals of the actual comparators in order to generate the interstitial output values. A final embodiment of the invention combines two averaging flash ADCs to form a novel subranging ADC.

17 Claims, 12 Drawing Sheets

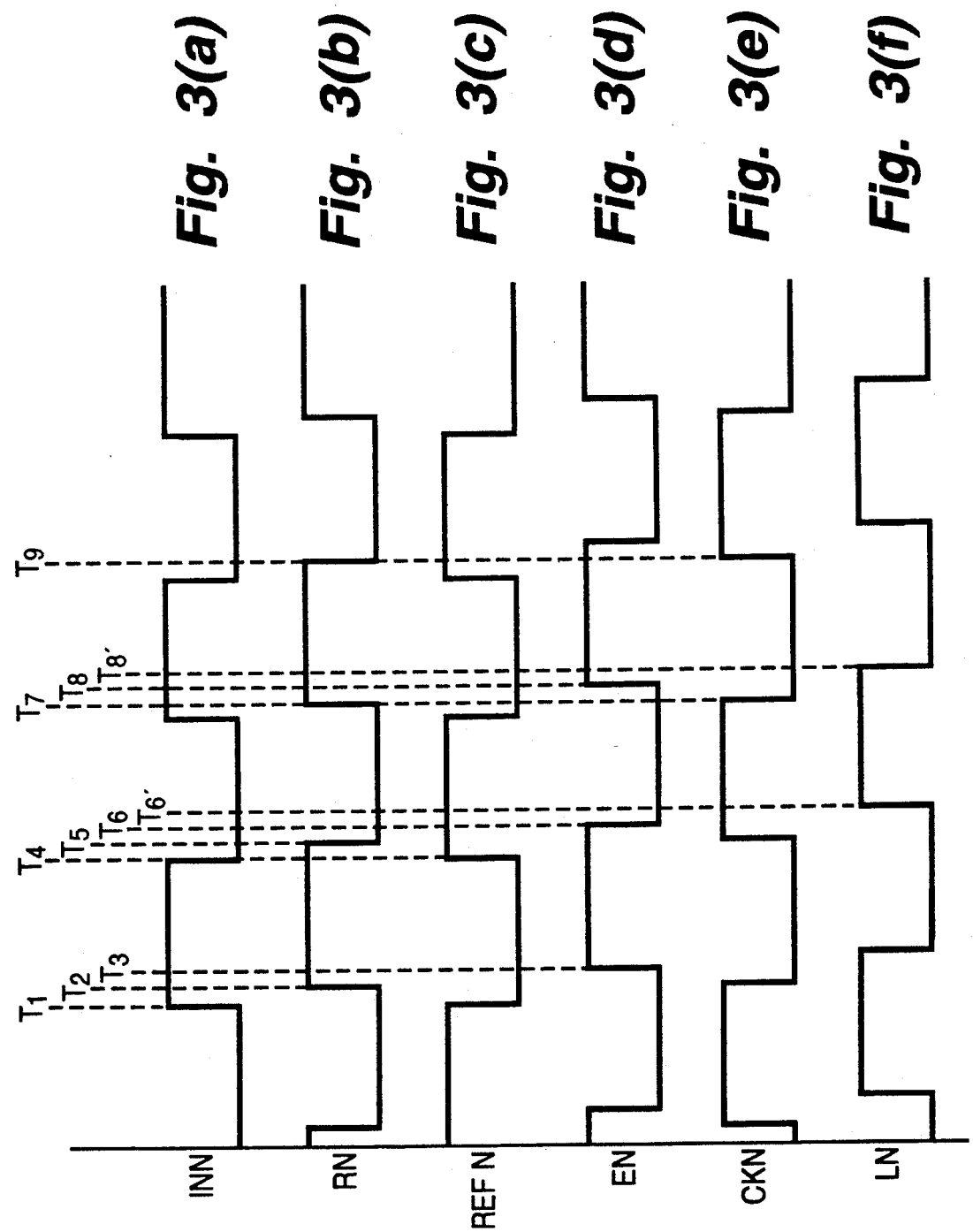

AVERAGING FLASH ANALOG-TO-DIGITAL CONVERTER

The invention is a flash-type analog-to-digital converter (ADC) and, more particularly, a high-resolution flash-type ADC having only $2^m$ comparators coupled to the analog input line but which produce n-bit digital values, where m is an integer less than n.

BACKGROUND OF THE INVENTION

A typical flash ADC uses $2^n - 1$ comparators to generate n-bit digital values which represent an analog input signal sampled at instants determined by its clock signal. For example, a typical 8-bit ADC uses $2^8 - 1 = 255$ comparators. A 10-bit ADC would use $2^{10} - 1 = 1023$ comparators. Each of these comparators is supplied with an analog input signal and one of $2^n - 1$ evenly spaced reference values. Comparators having reference values which are less than the input signal value provide a first logic state, for example logic-high, to a decoder while comparators having reference values which are greater than the input signal provide a second logic state, for example logic-low. The decoder is a thermometer type or a priority encoder which translates the $2^n - 1$ logic values provided by the respective comparators into an n-bit digital value.

Thus, in a flash ADC, the input signal is coupled to each of the $2^n - 1$ comparators. Each of which presents a load impedance to the input signal. Even if the comparators are designed to have a relatively low input impedance, the sum of the input impedances of all of the comparators can create a significant load which must be driven by the input signal. The relatively large input impedance of comparator arrays having more than 255 comparators makes classic flash-type ADCs impractical for digital values having more than 8 bits. This is true whether the input impedance is resistive and capacitive, such as is found in bipolar circuitry, or primarily capacitive such as is found in metal-oxide-semiconductor (MOS) circuitry.

In addition, relatively large flash ADCs are subject to integral and differential linearity errors. Integral linearity errors usually occur during high-speed operation when the current drawn by the input comparators through the reference ladder network produces significant additional potential drops across the reference resistors. When the reference input ports of the comparators present significant capacitive loads, the amount of current drawn, and thus, the potential drops across the ladder network are proportional to the clock frequency. Differential linearity error is a measure of the error offset of the worst comparator in the array. This type of error may be caused by mismatched or faulty components in an individual comparator or by an individual reference potential which is either too large or too small and generally increases as the number of comparators increases and/or as the potential difference between successive reference levels decreases.

K. Kattmann et al., in "A Technique for Reducing Differential Non-Linearity Errors in Flash A/D Converters," 1991 *IEEE International Solid State Circuits Conference*, pages 170-171, describe a high-speed ADC which exhibits significantly reduced differential linearity errors. The ADC uses differential preamplifiers to generate output signals each representing a difference between the input signal and a reference value. The output terminals of the preamplifiers are coupled to adjacent preamplifiers by a network of resistors. The resistor network sums the outputs of the preamplifiers surrounding the one which is closest to balance to find an average balance point. If the output signal of the preamplifier nearest to balance is not consistent with this averaged balance point, the resistor network changes the current flow to that preamplifier to adjust its gain and, so, the value of its output signal. This configuration has been found to reduce differential non-linearity errors by adjusting the gains of erroneous differential amplifiers in a sense which tends to reduce the magnitude of their errors.

U.S. Pat. No. 4,928,103 entitled PARALLEL ANALOG-TO-DIGITAL CONVERTER USING $2^{(n-1)}$ COMPARATORS describes an ADC which produces n-bit digital values using $2^n/2$ input comparators. Each of the input comparators has two complementary output signals. These signals are coupled to respective input ports of a latch which is configured to change state when the output signals of the preamplifier are equal. Signal values between any two reference values are decoded using latches which are coupled to respectively different output terminals of the preamplifiers associated with the two reference levels surrounding the level to be decoded. While this ADC design significantly reduces the loading of the input signal by requiring only $2^n - 1$ comparators to generate n-bit digital values, no further reduction can be achieved by inserting additional latches between the adjacent preamplifier stages.

SUMMARY OF THE INVENTION

The invention includes an ADC in which differences between the input signal and adjacent reference levels are combined in respectively different proportions to generate signal levels corresponding to comparisons which would be generated using interstitial reference levels. $2^{n-m}$ actual comparators are coupled to receive the input signal and $2^{m-1}$ pseudocomparators are coupled between each pair of actual comparators. This ADC generates n-bit digital values.

BRIEF DESCRIPTION OF THE DRAWING

FIGS. 3(a) to 3(f) are timing diagrams for the circuitry of FIG. 3

DETAILED DESCRIPTION

Figure 1:
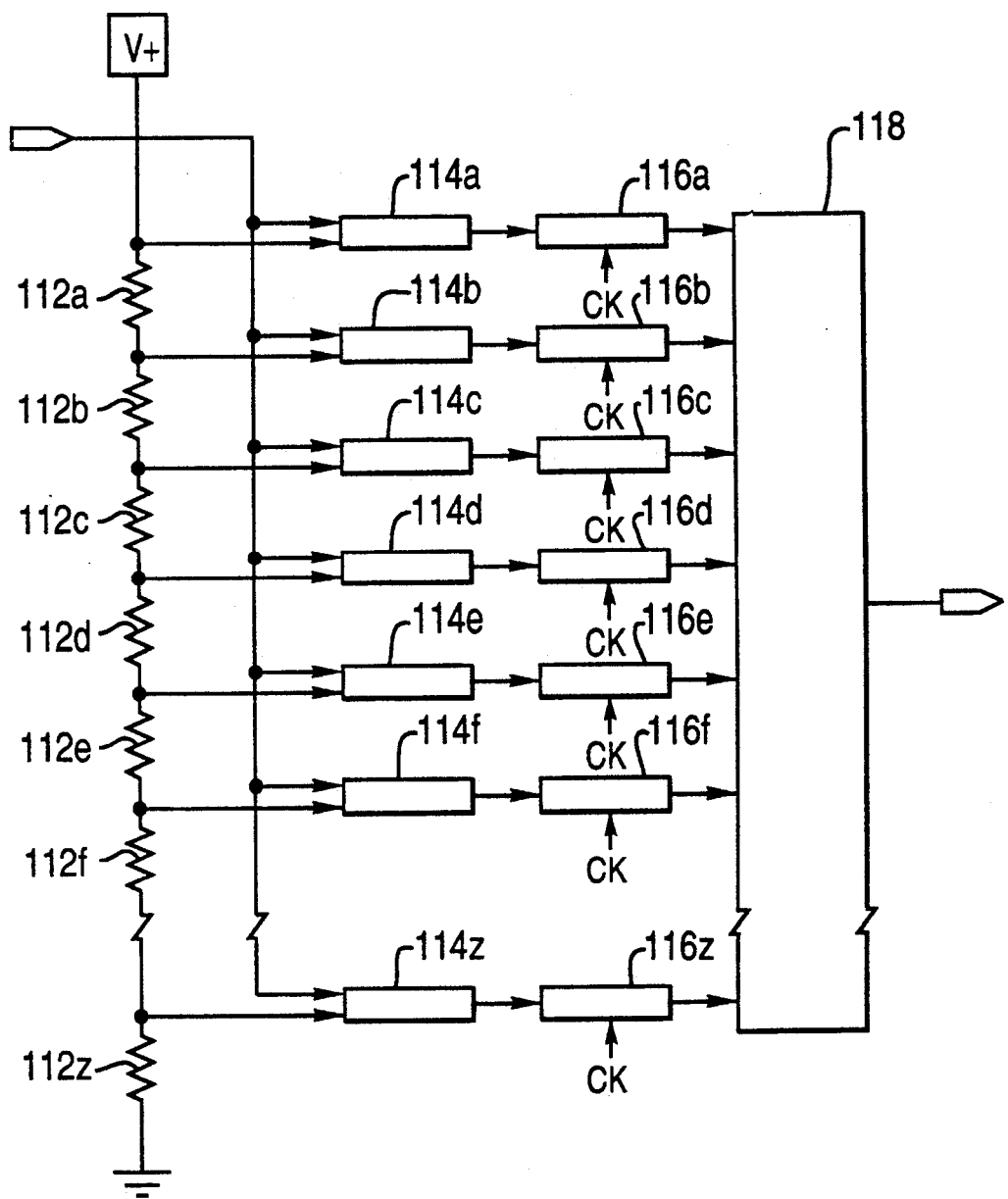
FIG. 1, is a block diagram of a prior art flash ADC.

FIG. 1 is a block diagram of a conventional flash-type ADC where an input signal IN is applied to a first input terminal of each of $2^n-1$ comparators 114a to 114z. A second input terminal of each comparators is coupled to receive a respectively different reference value provided by a resistor ladder which includes first and second sources of reference potential (V+ and ground) and $2^{n-1}$ serially connected resistors 112a to 112z. These resistors are desirably of equal value and are arranged as a voltage divider network such that the reference potential for any comparator is obtained from the junction of two of the resistors 112.

The comparators 114a to 114z amplify the difference between the input signal level and the reference level. Their output signals are below a predetermined logic threshold whenever the input signal value is greater than the respective reference signal value and is above a logic threshold value whenever the input signal value is less than the respective reference signal value. The output signals of these comparators are applied to respective latches 116a to 116z. Each of these latches is responsive to a clock signal CK to store the instantaneous output state of its associated comparator 114a to 114z. These stored values are applied to a decoder 118. Decoder 118 which may be a conventional thermometer type decoder, or a priority encoder, generates an n-bit digital output value representing the position in the ladder network of the reference potential which is closest in value to the input signal potential. That is to say, the number of the comparator highest in the chain which has a logic-high output signal, where the comparator coupled to ground by one reference resistor is number 1 and the comparator coupled to V+ is number $2-1$.

For relatively large numbers of bits in the digital output value, this type of ADC may present significant loads to the input signal IN and may be subject to significant integral and differential linearity errors.

Figure 2:
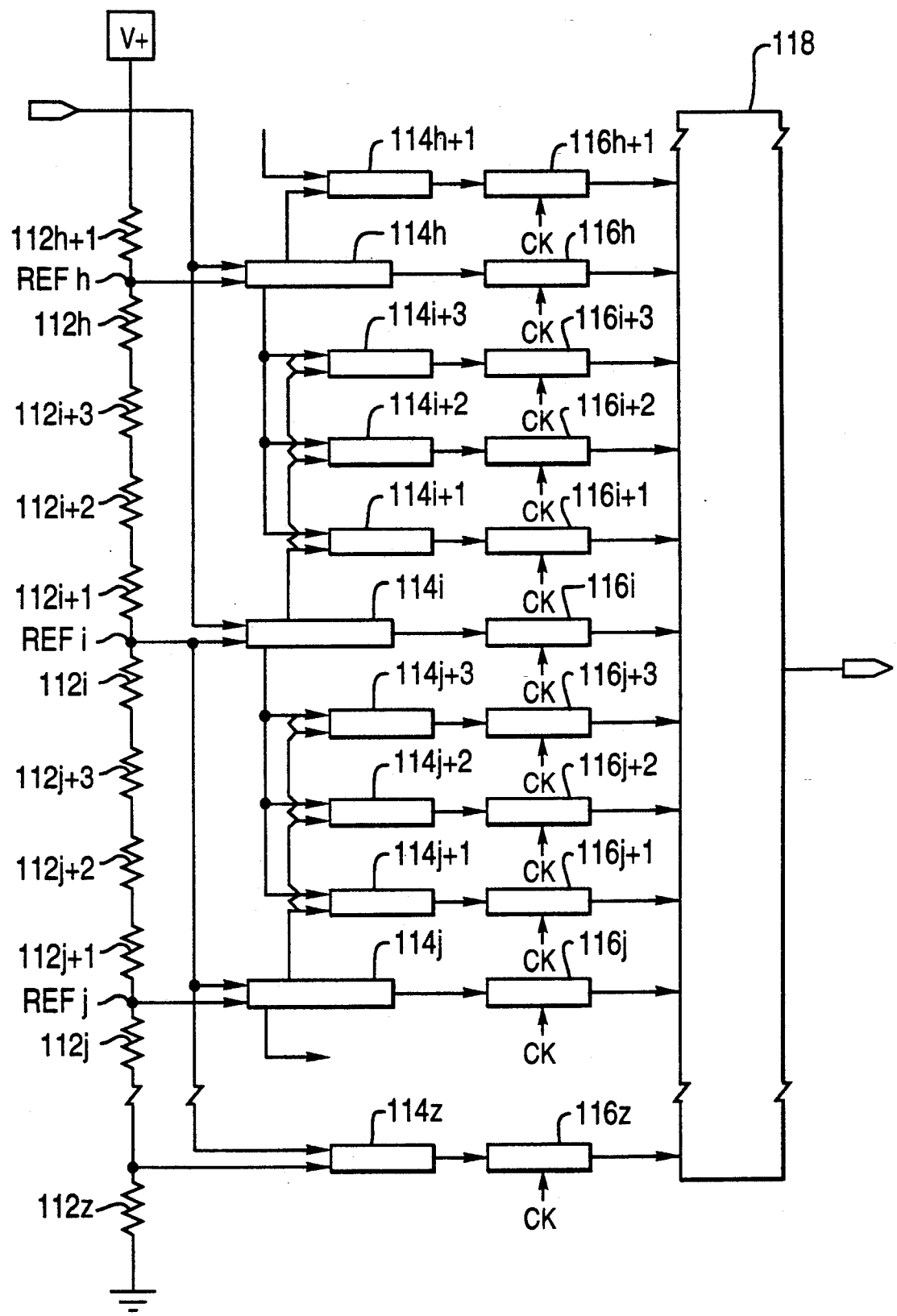
FIG. 2 is a block diagram of an ADC including an embodiment of the invention.

In the exemplary embodiment of FIG. 2, an ADC also produces n-bit digital output values but has only $2^{n-2}$ actual comparators which are coupled to the input signal and to the reference ladder. Here, the difference signal provided by each of the actual comparators is divided into seven component parts. One part is applied directly to a corresponding latch; three parts are coupled to respective pseudocomparators which determine input signal levels less than the level determined by the actual comparator; and the remaining three parts are coupled to other respective pseudocomparators which determine signal levels greater than the signal level determined by the actual comparator. Actual comparators 114b, 114i and 114j are coupled to the reference ladder 112 and to the input signal IN. Input signal levels between the levels determined by comparators 114i and 114h are determined by the pseudocomparators 114i+1, 114i+2 and 114i+3. Similarly, input signal levels between those determined by the comparators 114i and 114j are determined by the comparators 114j+1, 114j+2 and 114j+3.

In three of the embodiments described below, the output signal of comparator 114i is divided into seven parts. One-quarter of the signal is applied to latch 116i, three-sixteenths of the signal is applied to each of comparators 114i+1 and 114j+3, one-eighth of the signal is applied to each of comparators 114i+2 and 114j+2, and one-sixteenth of the signal is applied to each of comparators 114i+3 and 114j+1. All of the actual comparators are configured in the same manner such that comparator 114h provides one-quarter of its output signal to latch 116h, three-sixteenths of its input signal to comparator 114i+3, one-eighth of its output signal to comparator 114i+2, and one-sixteenth of its output signal to comparator 114i+1. In this configuration, each of the pseudocomparators 114i+1 to 114i+3 effectively compares the input signal against a respectively different reference signal value which is evenly spaced between the reference signal values used by the comparators 114i and 114h. The output signals of the comparators 114i+1 to 114i+3 are applied to respective latches 116i+1 to 116i+3.

To understand how the pseudocomparators operate, recall that the output signals of the actual comparators are the amplified differences between the input signal and the respective reference values applied to the actual comparators. If, for example, the output value of comparator 114j is positive, indicating that the reference value REFj is greater than the input signal IN, and the output signal of comparator 114i is negative, indicating that the reference value REFi is less than the input signal IN, then the balance point, the point where the reference potential equals the input signal, must lie between stages i and j.

Each of the pseudocomparators 114j+1 to 114j+3 sums the output signals of the two actual comparators in a different relative proportion ($\frac{1}{4}$, $\frac{3}{4}$), ($\frac{1}{2}$ $\frac{1}{2}$) or ($\frac{3}{4}$, $\frac{1}{4}$). Depending on the relative magnitudes of the signals provided by the actual comparators, some of these summed values are negative and some are positive. As with the actual comparators, the dividing point between pseudocomparators which provide positive output values and pseudocomparators which provide negative output values determines the digital output value. This method produces the same results as comparing the input signal to three evenly spaced reference values between the values REFj and REFi.

The output signals of the latches coupled to the comparators and the latches coupled to the pseudocomparators are applied to respectively different input terminals of the decoder 118 in the same manner as in the flash ADC of FIG. 1.

The ADC of FIG. 2 has advantages over that of FIG. 1 because, for a given number of digital output bits, there are fewer comparators coupled to the input signal and fewer comparators coupled to the reference ladder. This results in reduced integral nonlinearity errors since there is less of a load applied to the input signal IN and to the reference ladder, even during high-speed operation.

In addition, differential nonlinearity errors are reduced by a factor of $\frac{1}{4}$ in the ADC of FIG. 2 with respect to that of FIG. 1. As described above, differential linearity errors are measured by the comparator and/or reference value which exhibits the largest deviation from the uniform step size between successive reference values. In the decoder of FIG. 2, any such deviation is averaged among seven stages, i.e., an error in the signal produced by comparator 114i would be averaged among comparators 114j+1, 114j+2, 114j+3, 114i, 114i+1, 114i+2 and 114i+3.

Furthermore, the ADC of FIG. 2 may use a simpler reference ladder than that of FIG. 1. Although the reference ladder of FIG. 2 includes $2^n-1$ resistors coupled in series, an ADC having the same characteristics as that of FIG. 2 could be made using only $2^{n-2}-1$ resistors. In this configuration, resistors $112i+1$, $112i+2$, $112i+3$ and $112h$ would be combined into a single resistive element; likewise resistors $112j+1$, $112j+2$, $112j+3$ and $112i$ would be combined into one element.

Figure 2A:
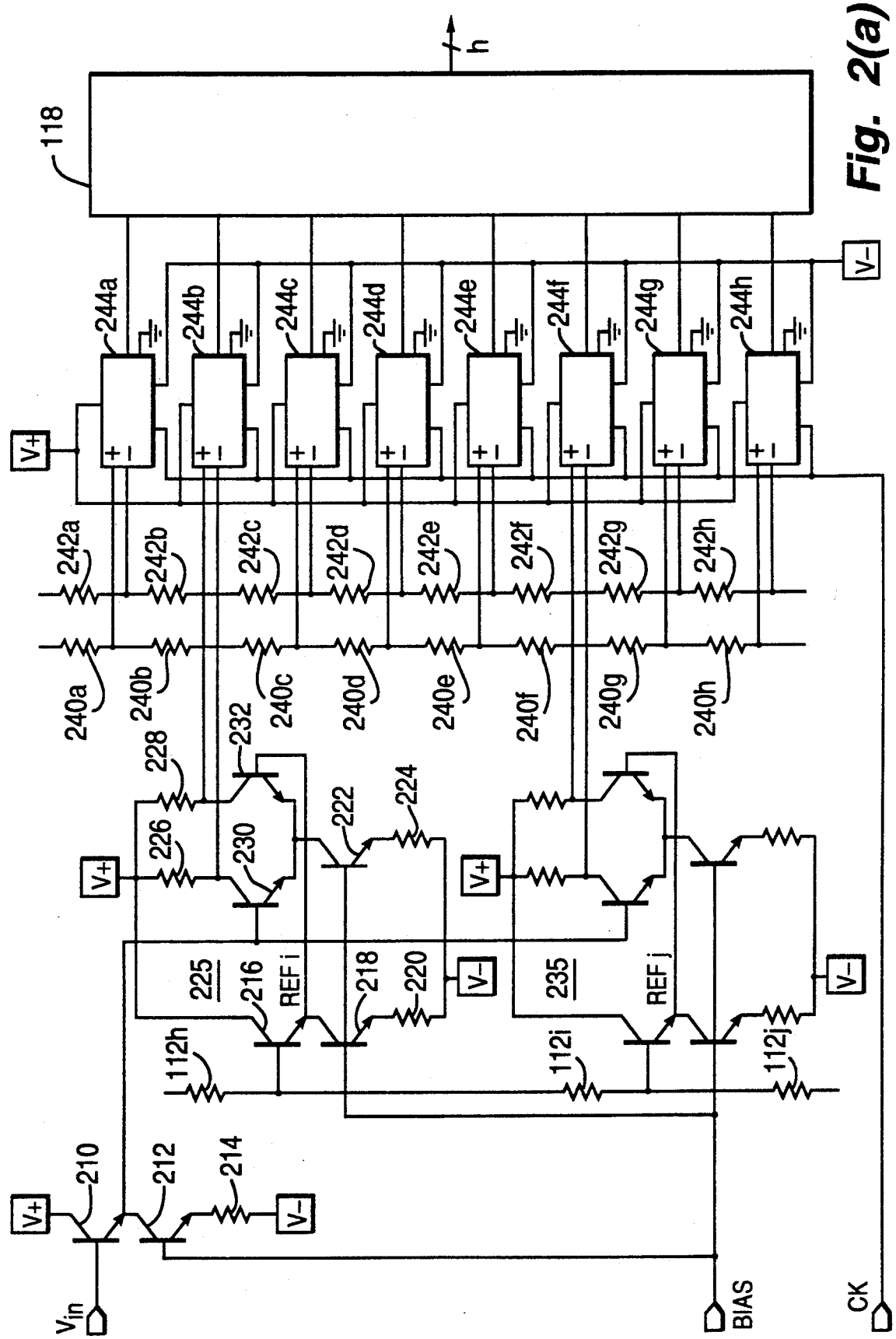
FIG. 2(a) is a schematic diagram partly in block diagram form showing circuitry suitable for use in the ADC of FIG. 2.

In FIG. 2(a) a BiCMOS implementation of the ADC of FIG. 2 includes bipolar circuitry in its input stages and differential preamplifiers and CMOS circuitry in its comparator and latches. In FIG. 2(a), the input signal IN is applied to a buffer amplifier which includes transistors 210, 212 and resistor 214. Transistor 212 and resistor 214 constitute a controlled current source which provides a fixed amount of current at the emitter of transistor 210. The amount of current provided is determined by the value of the resistor 214 and the input signal BIAS. Since the current provided by transistor 212 is constant, the effect of varying the input signal voltage IN is to change the potential at the junction of the emitter of transistor 210 and the collector of transistor 212.

This buffered input potential is applied to a first input terminal (e.g. to the base electrode of transistor 230) of each of $2^{n-2}$ identical preamplifiers which form the actual comparators of the ADC. Two of these preamplifiers, 225 and 235, are shown in FIG. 2(a). For the sake of brevity, only preamplifier 225 is described in detail. The reference input signal to preamplifier 225 is generated by a reference ladder which includes $2^{n-2}-1$ serially connected resistors, three of which, $112i$, $112j$ and $112k$ are shown in FIG. 2(a). The junction of each pair of resistors in the reference ladder is coupled to a respective buffer amplifier which includes transistors 216 and 218 and resistor 220. Transistor 218 and Resistor 22 are configured as a constant current source providing a constant amount of current, at the junction of the collector of transistor 218 and the emitter of transistor 216, determined by the values of resistor 220 and the control input signal BIAS.

This buffered reference potential is applied to a second input of the preamplifier 225, the base of transistor 232. Transistors 230 and 232 are configured as a conventional differential amplifier. Transistor 222 and resistor 224 are provide a constant current to the coupled emitters of the transistors 230 and 232 depending on the value of the resistor 224 and the control input signal BIAS. Load resistors 226 and 228 couple the respective transistors 230 and 232 to a source of operating potential V+. The output signal of the preamplifier 225 is the difference between the output signal at the collector electrode of transistor 230 and the output signal at the collector electrode of transistor 232. In the exemplary embodiment, the signal between these two electrodes is the potential difference between the input signal IN and the reference signal provided at the junction of resistors $112i$ and $112j$, amplified by the combined gain of the input buffers and the differential preamplifier. In the exemplary embodiment this amplification factor is approximately equal to 12. For simplicity, the output terminals of transistors 232 and 230 are referred to below respectively as the positive and negative output terminals of the preamplifier 225.

The positive output terminals of each of the preamplifiers in the ADC (e.g. 225 and 235) are coupled together via a resistor ladder which includes serially connected resistors 240a to 240b. The negative output terminals of the preamplifiers are coupled together in the same manner by a resistive ladder which includes serially connected resistors 242a to 242h. These resistor ladders have two effects. First, they divide the respective positive and negative output potentials of the adjacent preamplifier stages into four equal parts and, second, they average the gains of the preamplifier stages in the same manner as described in the above-referenced paper by Kattmann et al.

The first effect of these resistor ladders, i.e., the dividing of the respective output difference signals of the preamplifiers, allows the balance point of the ADC to be determined with a high degree of accuracy. If, for example, the positive output potential of preamplifier 235 is greater than the negative output potential while the negative output potential of preamplifier 225 is greater than its positive output potential, then the balance point lies somewhere between the preamplifiers 225 and 235. Since these amplified potentials are divided into four equal parts by the resistors 240c to 240f and 242c to 242f, the signals taken at the junction of these respective resistor ladders exhibit an even gradation between the two difference values. At some point in this gradation, the potential difference between one pair of junctions is positive while the corresponding potential between the next pair of junctions is negative. This further refines the balance point as lying between the pseudoreference levels represented by these pseudocomparators.

The output signals of preamplifier 225 are applied directly to comparator/latch 244b while the output signals of preamplifier 235 are applied directly to the comparator/latch 244f. The intermediate signals developed at the junction of resistors 240c and 240d and at the junction of resistors 242c and 242d are applied to comparator/latch 244c. Similarly, intermediate signals developed at the junctions of the other resistors in the ladder between preamplifiers 225 and 235 are applied to comparator/latches 244d and 244e. The combination of the resistor ladders and comparator/latches forms the pseudocomparator network for the ADC of FIG. 2(a). The output signals of the comparator/latches 244 are applied to respectively different input ports of a thermometer-to-binary decoder 118.

Figure 2B:
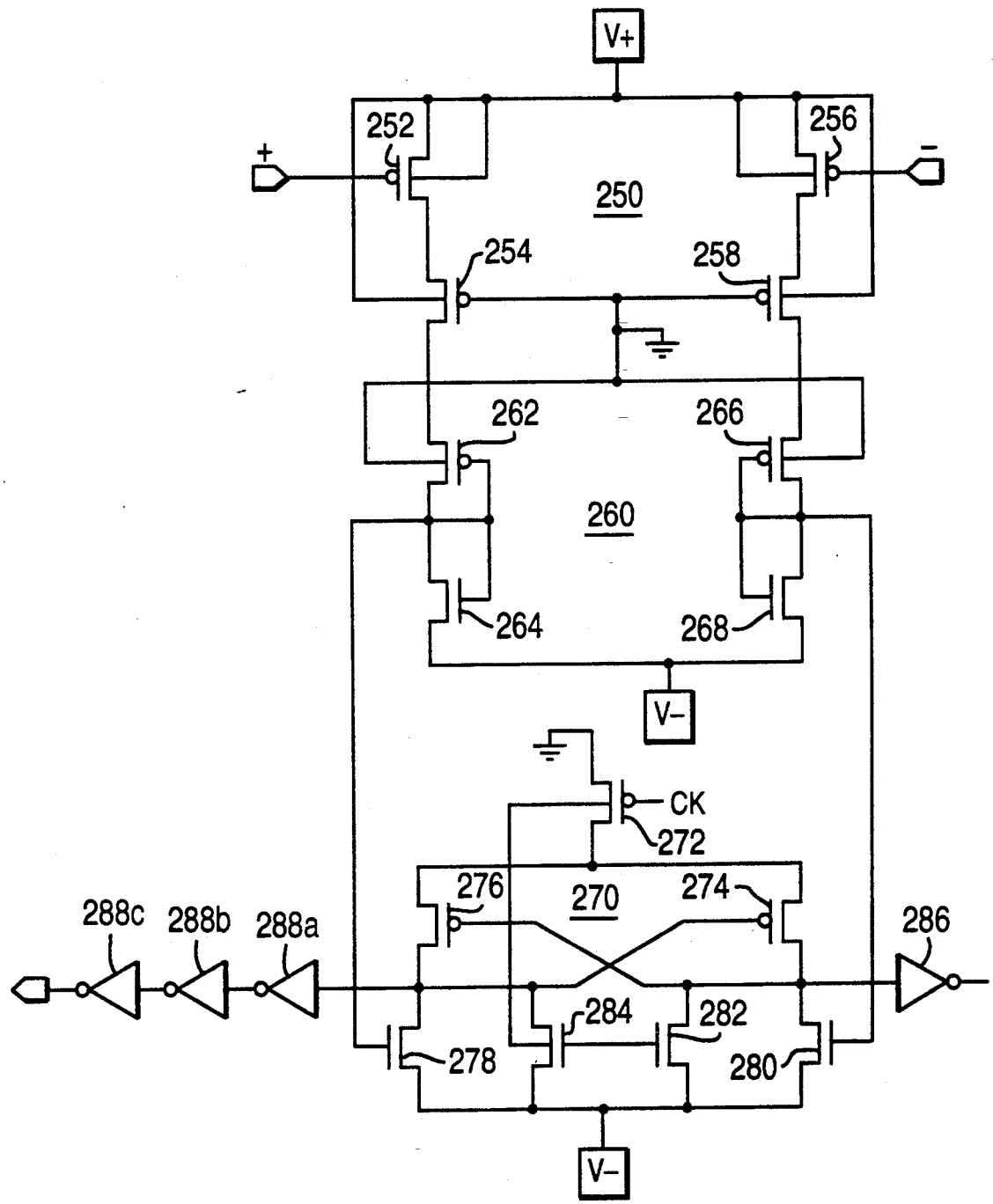
FIG. 2(b) is a schematic diagram showing a suitable comparator/latch for the ADC of FIG. 2(a).

Circuitry suitable for use as one of the comparator/latches 244, shown in FIG. 2(b), includes a buffer stage 250, a level shifter 260 and a latch 270. The buffer 250 includes four P-channel MOS (P-MOS) transistors 252, 254, 256 and 258. This circuit produces respective output signals at the drain electrodes of transistors 254 and 258 which vary in amplitude between the source of operating potential V+ and a source of reference potential (e.g. ground) and which are amplified with respect to the positive and negative output signals of the preamplifiers. In the exemplary embodiment, these buffer amplifiers have a gain of approximately 3.5.

Shifter 260 includes two P-MOS transistors 262 and 266 and two N-channel MOS (N-MOS) transistors 264 and 268 and converts the signals provided by the buffer 250 into signals which vary between ground and a source of negative operating potential, V−.

The output signals of the shifter 260 are taken from the interconnected drain and gates of the transistors 266 and 268 on the one hand, and from the interconnected drain and gates of the transistors 262 and 264 on the other hand. These signals are applied to respectively different input terminals of latch 270. Latch 270 includes P-MOS transistors 272, 274 and 276 and N-MOS transistors 278, 280, 282 and 284. The source electrodes of transistors 274 and 276 are coupled to ground through the transistor 272, the gate of which is coupled to receive the clock signal CK. The source electrodes of transistors 278, 280, 282 and 284 are coupled to V—.

The inputs to the latch 270 are the gates of the transistors 278 and 280. The output of the latch is at the junction of the drain electrodes of transistors 276 and 278 and the gate of transistor 274. This output is coupled through three serially connected inverters 288a, 288b and 288c to the decoder 118 (not shown). A complementary output terminal of the latch 270 is at the junction of the drain electrodes of transistors 274 and 280 and the gate of transistor 276. This output terminal is coupled to the input of an inverter 286 which is used to hold a portion of the state of latch 270.

The circuitry of FIG. 2(b) operates as follows. When the positive and negative output signals of the preamplifier which feeds the circuitry of FIG. 2(b) are both equal (i.e., the reference signal is exactly equal to the input signal), then the output signals of the buffers 250, provided at the respective drains of transistors 254 and 258 are also equal. In this instance, the output signals of the shifter 260 are also equal. In this embodiment, these signals, when equal, hold the input terminals of the latch 270 at a threshold potential just less than the potential necessary to render the transistors conductive.

Thus, if the positive output signal of the preamplifier is slightly greater than the negative output signal, the potential at the drain of transistor 258 is greater than that at the drain electrode of transistor 254. In this instance, the input signal applied to the gate of transistor 280 by the level shifter is greater than that applied to the gate of transistor 278. When the clock signal, CK, becomes logic-low (i.e., V—), transistor 272 is rendered conductive, transistors 284 and 282 are rendered nonconductive and the output signal of the latch 270, which is applied to the input terminal of the inverter 288a, is logic-high (i.e., ground). The state of the latch 270 is stored on the input gates of the transistors 288a and 286. This state is cleared (i.e., reset to logic-low) when the clock signal has a logic-high value. In this instance, transistor 272 is rendered nonconductive and transistors 282 and 284 are rendered conductive. Thus, the output signal of latch 270 is only valid while the clock signal CK in a logic-low state.

Figure 3:
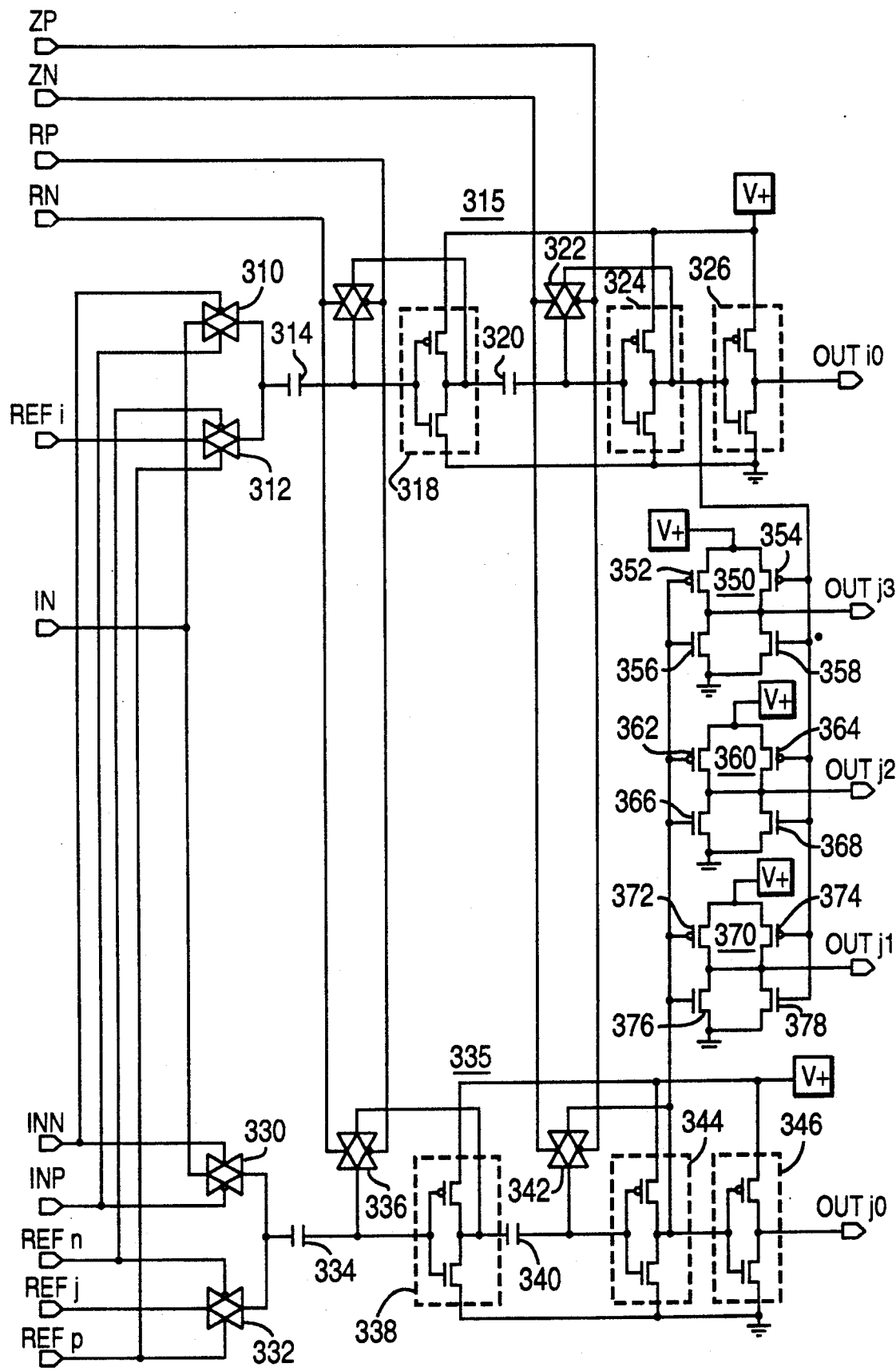
FIG. 3 is a schematic diagram showing circuitry suitable for use in the ADC of FIG. 2.

In FIG. 3 the ADC of FIG. 2 is implemented entirely in CMOS technology. For the sake of simplicity, the reference ladder and the output latches have been omitted from the circuitry of FIG. 3.

Each actual comparator of the ADC of FIG. 3 (e.g. 315) includes: two transmission gates, for example, 310 and 312; a capacitor 314; a first autozeroed amplifier, which includes a CMOS inverter 318 and a transmission gate 316; a second capacitor 320; a second autozeroed amplifier, which includes a CMOS inverter 324 and a transmission gate 322; and an output inverter 326. Each of these comparators is coupled to six pseudocomparators, three of which, 350, 360 and 370, are shown. Each of the pseudocomparators consists of two paralleled CMOS inverters.

The amount of signal distributed from the actual comparator to each of the pseudocomparators is controlled by the relative widths of the gates used to form each of the paralleled inverters. In the exemplary embodiment, the gate widths of the transistors in the inverter 326, the transistors 354 and 358 in the pseudocomparator 350, the transistors 364 and 368 in the pseudocomparator 360 and the transistors 374 and 378 in the pseudocomparator 370 are configured such that one-quarter of the charge provided by inverter 324 is applied to the inverter 326; three-sixteenths is applied to pseudocomparator 350; one-eighth is applied to pseudocomparator 360 and one-sixteenth is applied to pseudocomparator 370. The other three pseudocomparators coupled to the actual comparator 315 are configured in the same manner as the comparators 370, 360 and 350 with respect to the actual comparator 335. In this configuration, the comparator 335 applies one-fourth of the charge to the gates of the transistors of inverter 346, three-sixteenths of the charge to the transistors of the inverter in pseudocomparator 370, one-eighth of the charge to the transistors in the pseudocomparator 350 and one-sixteenth of the charge to the transistors in pseudocomparator 360.

From this, it is apparent that the ratio of the widths of the transistors 352 to 354 is one to three as is the ratio of the widths of transistors 356 and 358. The widths of transistors 362 and 364 and of transistors 366 and 368 is one to one and the ratio of transistors 372 to 374 and 376 to 378 is three to one.

This configuration produces signals at the outputs of pseudocomparators 350, 360 and 370 which represent the comparison of the input signal to three pseudoreference levels which are substantially evenly spaced between the actual reference levels applied to the actual comparators 315 and 335.

Referring to FIGS. 3(a) to 3(f), the circuitry of FIG. 3 operates as follows. For the sake of brevity, only the operation of the actual comparator 315 and the pseudocomparators 350 and 360 is described below. Each of the gates 310, 312, 316 and 322 of the actual comparator 315 are coupled to receive complementary control signals. Only one of these control signals, the one applied to the N-FET of the transmission gate, is shown in FIG. 3(a) and is described below. It is readily understood by one of ordinary skill in the art that a control signal of opposite polarity is applied to the P-FET of each of the transmission gates.

Referring to FIGS. 3 and 3(a) to 3(f), at time $T_1$ the transmission gate 310 is enabled, via the signal INN, to apply the input signal IN to one plate of the capacitor 314. Also at time $T_1$, the signal REFN becomes logic-low rendering the transmission gate 312 nonconductive. At time $T_2$, shortly after time $T_1$, the signal RN which controls the transmission gate 316 becomes logic-high, causing this gate to couple the output of inverter 318 to its input. Thus, between times $T_2$ and $T_5$, the inverter 318 is autozeroed; that is to say, a charge is placed on the gates of the inverter 318 and, so, on the other plate of the capacitor 314, which substantially compensates for any input signal charge provided to the one plate of the capacitor 314 during the interval $T_1$ to $T_4$.

At time $T_4$, the gate 310 is disabled and the gate 312 is enabled allowing the reference input potential for the actual comparator 315 to charge the capacitor 314. Since the inverter 318 was autozeroed while the input charge was applied to the capacitor 314 and since the autozeroing of the inverter 318 ceases at time $T_5$, shortly after time $T_4$, the signal applied to the gates of the inverter 318, between time $T_5$ and the time $T_7$, is the difference between the input signal INN and the reference potential REFj. Between times $T_3$ and $T_6$, which substantially overlap the time interval between times $T_2$ and $T_5$, the signal ZN renders the gate 322 conductive to autozero the inverter 324.

At time $T_5$, the control signal RN causes the gate 316 to be non-conductive, allowing the difference signal developed across the capacitor 314 to be amplified, inverted and applied to the capacitor 340. At time $T_6$, shortly after time $T_5$, when the gate 322 is rendered nonconductive by the signal ZN, the signal applied to the gates of the inverter 324 is the inverse of the amplified difference between the signals IN and REFj, developed by the inverter 318. This signal is amplified through the inverters 324 and 326 in the time interval between times $T_6$ and $T_8$. At time $T_7$, prior to time $T_8$, the signal provided by the inverter 326 is captured by a latch (not shown), coupled to the output terminal OUTJ0. This latch which may, for example, be identical to the latch 270 of FIG. 2(b), latches the input signal provided at terminal OUTJ0 coincident with a negative-going transition of the clock signal CKN occurring at time $T_7$. The signal is held in the latch until time $T_9$ when the positive-going edge of the signal CKN resets the latch.

Also between times $T_5$ and $T_8$, the charge developed at the output of inverter 324 is shared across the gates of the inverters 326 and the pseudocomparators 350, 360 and 370. As described above, this charge is shared in proportion, with the gates of inverter 326 receiving one-quarter of the charge, the gates of transistors 354 and 358 of the pseudocomparator 350 receiving three-sixteenths of the charge, the gates of transistors 364 and 368 of pseudocomparator 360 receiving one-eighth of the charge and the gates of transistors 374 and 378 of pseudocomparator 370 receiving one-sixteenth of the charge.

Actual comparator 335 operates in the same manner as comparator 315. It provides one-quarter of its output charge to the gates of the inverter 346, three-sixteenths of its output charge to the gates of transistors 372 and 376 of pseudocomparator 370, one-eighth of its charge to the gates of transistors 362 and 366 of pseudocomparator 360 and one-sixteenth of its charge to the gates of transistors 352 and 356 of pseudocomparator 350.

If both of the signals provided by the actual comparators 315 and 335 are of the same polarity, then the output signals of the pseudocomparators 350, 360 and 370 are of the opposite polarity. If, however, the output signals of the actual comparators have different polarities, then the pseudocomparators 350, 360 and 370 become voltage dividers which generate output potentials that are proportional to the ratio of the transistor widths and to the magnitude of the difference signals developed by the comparators 335 and 315. These signals are applied to latches (not shown) such as the latch 270, of FIG. 2(b), which, in turn, provide output signals for the decoder 218 (not shown).

Figure 4:
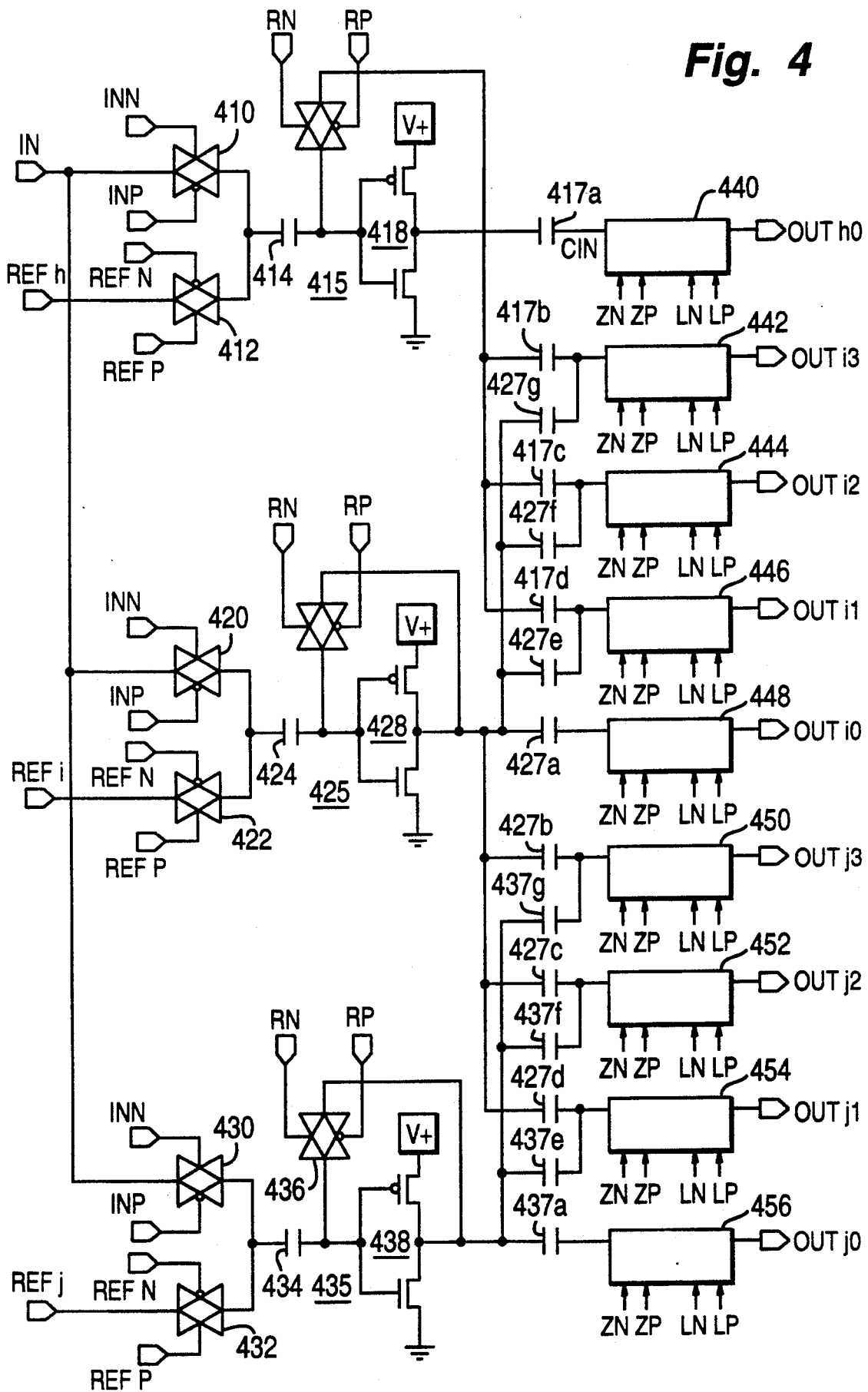
FIG. 4 is a schematic diagram partly of circuitry suitable for use in the ADC of FIG. 2.
Figure 4A:
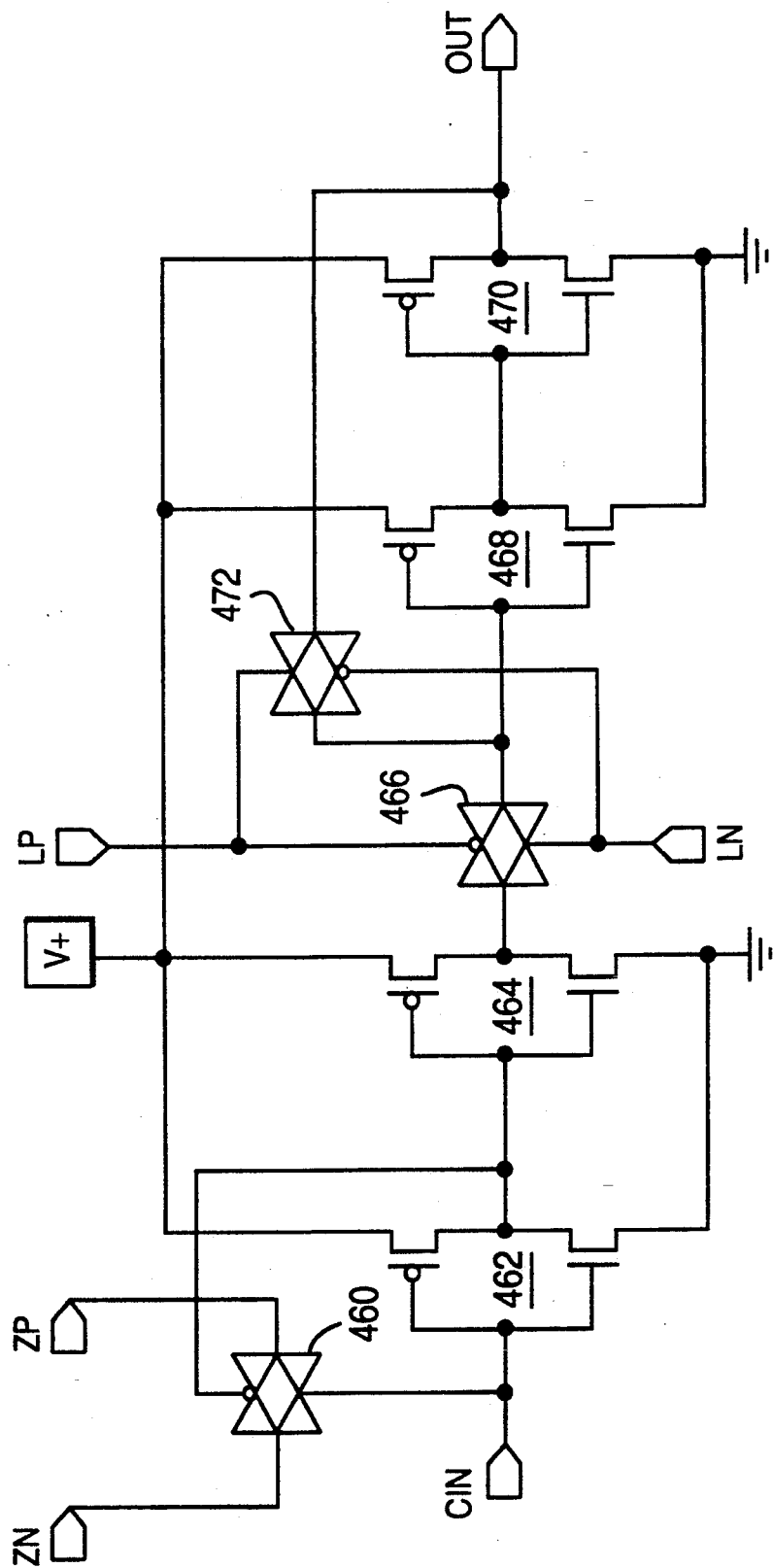
FIG. 4(a) is a schematic diagram of circuitry suitable for use as the comparator/latch of the ADC of FIG. 4.

A third embodiment of the ADC of FIG. 2 is described in FIGS. 4, 4(a), 4(b) and 5. The circuitry of FIGS. 4 and 4(a) is similar to that shown in FIG. 3. The circuitry of FIG. 4, however, deletes the pseudocomparators 350, 360 and 370 from the circuitry of FIG. 3 and, in their place, inserts three capacitors in parallel with the capacitor 320.

The circuitry of FIG. 4 includes three identical actual comparators 415, 425 and 435 and six identical pseudocomparators 442, 444, 446, 450, 452 and 454. Referring by example to actual comparator 425, each of the actual comparators includes a transmission gate 420, which couples the input signal IN to the comparator; a second transmission gate 422, which couples the comparator to its reference potential, for example, REFj; a capacitor 424; an autozeroed amplifier, which includes CMOS inverter 428 and transmission gate 426; a capacitor 427a and a comparator/latch 448. Exemplary circuitry suitable for use as the comparator/latch 448 is described in reference to FIG. 4(a).

Each of the elements 420, 422, 424, 426 and 428 operate in the same manner as the corresponding elements 310, 312, 314, 316 and 318, described above. In FIG. 4, however, instead of applying the output signal of the inverter 428 to a single capacitor (e.g. capacitor 320 of FIG. 3), it is applied to a set of seven capacitors 427a to 427g. The capacitors in the set are fabricated such that if capacitor 427a has a capacitance of 4 C, then 427b and 427e will each have capacitances of 3 C while 427c and 427f have capacitances of 2 C and 427d and 427g each have capacitances of 1 C. These ratios may be accurately maintained using one of many currently available semiconductor fabrication processes which allow relative capacitance to be closely controlled.

As is well known, the charge provided by a circuit divides in proportion to the output capacitances driven by the circuit. Thus, in the exemplary embodiment, one-quarter of the charge provided by the inverter 428 is applied to capacitor 427a, three-sixteenths of the charge is applied to each of capacitors 427b and 427e, one-eighth of the charge is applied to each of capacitors 427c and 427f, and one-sixteenth of the charge is applied to each of capacitors 427d and 427g. All of the actual comparators are configured in the same manner as comparator 425.

Each of the comparator/latches coupled to an actual comparator receives input signals from only one capacitor. For example, comparator 448 receives input signals only from capacitor 427a. The comparator/latches in the pseudocomparators, however, receive input signals from two capacitors, each of which is coupled to a respectively different actual comparator. For example, comparator/latch 446 receives input signals from actual comparator 425 via capacitor 427e and from actual comparator 415 via capacitor 417d. The charges provided by the respective actual comparators sum at the input terminal of the comparator/latch for each of the pseudocomparators. Thus, pseudocomparator 446 receives three-sixteenths of the output signal of comparator 425 and one-sixteenth of the output signal of actual comparator 415; pseudocomparator 444 receives one-eighth of the output signal of each of comparators 415 and 425; and pseudocomparator 442 receives three-sixteenths of the output signal of actual comparator 415 and one-sixteenth of the output signal of actual comparator 425.

In this configuration, the input terminals of each of the comparator/latches of the pseudocomparators receive a signal which represents a weighted average of the difference between the input signal and the respective reference signals of the two adjacent actual comparators. Thus, the circuitry of FIG. 4 averages the difference signals generated by each actual comparator among three interstitial comparators in the same manner as the ADCs of FIGS. 2 and 3.

All of the comparator/latches 440 to 456 may be identical and may be, for example, as shown in FIG. 4(a). The comparator/latch of FIG. 4(a) includes an autozeroed amplifier comprising CMOS inverter 462 and transmission gate 460, a buffer inverter 464, two transmission gates 466 and 472, and a latch formed by two cross-coupled inverters 468 and 470.

In FIGS. 3(a) to 3(f), the circuitry of FIGS. 4 and 4(a) operates as follows. Between times $T_1$ and $T_4$ when the control input signal INN is logic-high, transmission gate 410 is enabled to pass the input signal into the capacitor 414. During this time interval, the capacitor 414 charges to a potential equal to that of the input signal. While the capacitor is charging, however, between time intervals $T_2$ and $T_5$, the signal RN is in a logic-high state.

In response to this signal, the gate 416 applies the output of inverter 418 to its input terminal. In this configuration, the input terminal of the inverter 418 is held at its switching potential. Thus, at time $T_5$ when both of the gates 410 and 416 are in a nonconductive state, the capacitor 414 provides a potential substantially equal to the inverse of the input potential to the gates of the inverter 418.

At time $T_3$, the input control signal REFN becomes logic-high causing the gate 412 to apply the reference potential REFi to the capacitor 414. At this time, the input signal to the inverter 418 is the difference between the input signal IN and the reference signal REFi. This signal is amplified by the inverter 418 and applied to the set of capacitors 417 which are coupled to the actual comparator 415. In FIG. 3(d), while the signal provided by the inverter 418 is being applied to capacitors 417, the input inverter 462 of the comparator/latch 440 is enabled, by the signal ZN, to amplify the summed potentials.

During the time interval $T_6'$ to $T_8'$ the signal LN is logic-high, rendering the gates 466 and 472 conductive and nonconductive, respectively. At time $T_8'$ when the signal LN becomes logic-low, the conductive states of the gates 466 and 472 are reversed, storing the signal provided by the inverter 464 in the latch 475.

For each of the actual comparators 415, 425 and 435, the value held by the latch 475 is the difference between the input signal IN and the respective reference signal values REFi, REFj and REFk, multiplied by the amplification factor provided by the inverters 418, 462 and 464. The latch 475 further amplifies this signal and limits it to the V+ and ground operational potentials. Thus, a very slight positive difference between the input signal IN and the signal REFj, for example, produces a logic 1 at the output terminal OUT1 of the comparator 440. Likewise, a very slight negative difference between these two signals produces an output signal logic 0 at the output terminal of comparator 440.

Each of the pseudocomparators 442, 444 and 446 receives a weighted sum of the amplified output signals provided by the actual comparators 415 and 425. When, for example, the output signal of comparator 448 is logic-high, indicating that the input signal IN is less than the reference signal REFj, and the output signal of the comparator 440 is logic-low, indicating that the reference signal REFi is less than the input signal IN, the output signals of the comparators 442, 444 and 446 are either logic-high or logic-low indicating the amount by which the difference value provided the actual comparator 415 exceeds the difference value provided by the comparator 425.

If, for example, the difference between REFi and IN is negative and three times the difference between REFj and IN, then the output signal of the comparator/latch 446 will be logic-low while the output signals of comparator/latches 444 and 442 will be logic-high. If the two difference values are equal in magnitude and of opposite sign, then the output signals of comparator/latches 444 and 446 will be logic-low and the output of comparator/latch 442 will be logic-high.

Figure 4B:
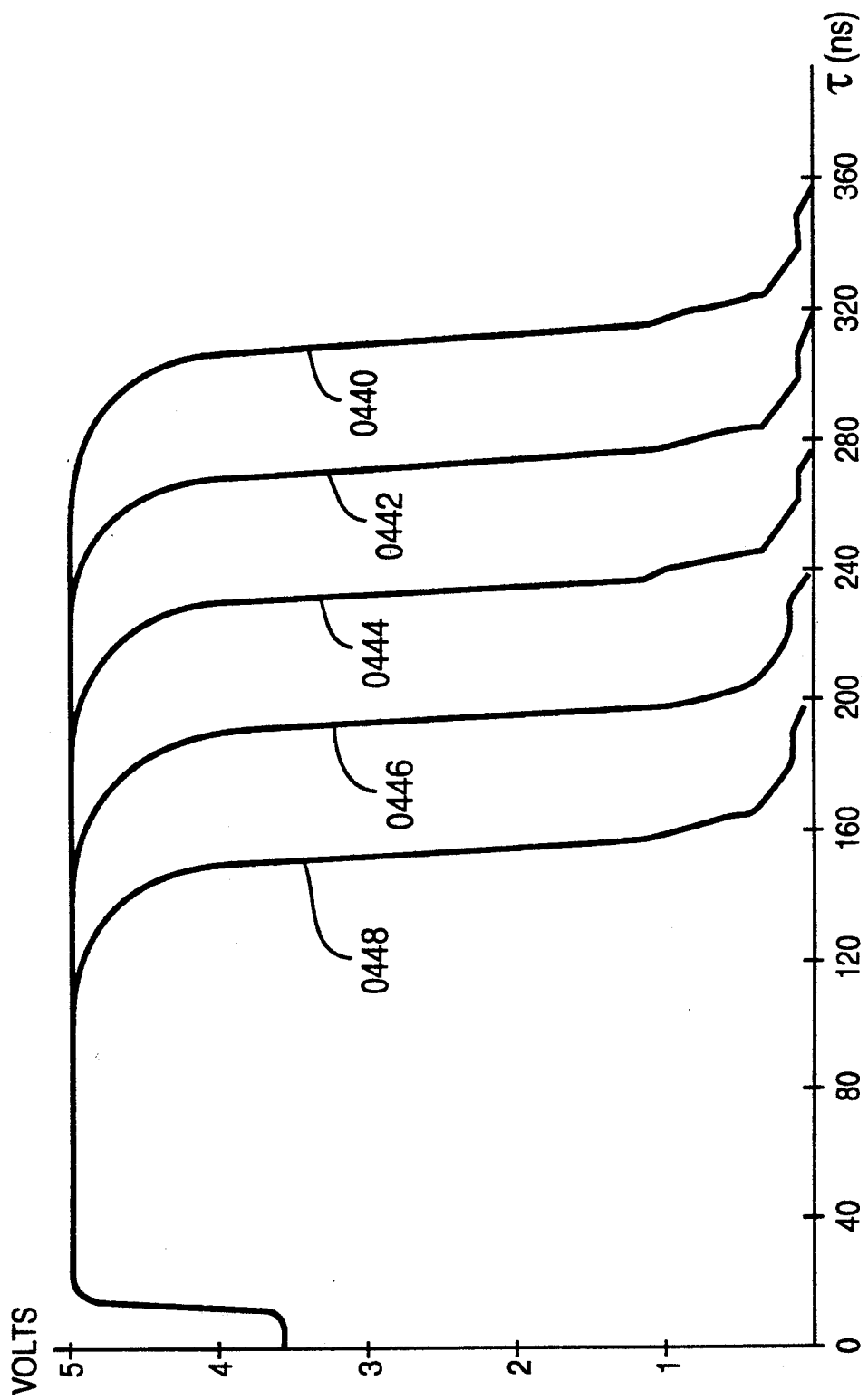
FIG. 4(b) is a graph of voltage versus time useful for describing the operation of the circuitry of FIGS. 4 and 4(a).

FIG. 4(b) is a graph of the output signals provided by the comparator/latches 440 to 448 in response to an increasing linear ramp input signal IN (not shown). In FIG. 4(b), when the value of the ramp signal is low, all of the output signals are logic 1; as the value of the ramp signal increases, the output signals of each of the comparators become logic 0, first with comparator 448 and 446, then 444, 442 and, finally 440. The even spacing between the curves is an indication of the linearity of the result produced by the ADCs of FIGS. 4 and 4(a).

Figure 4C:
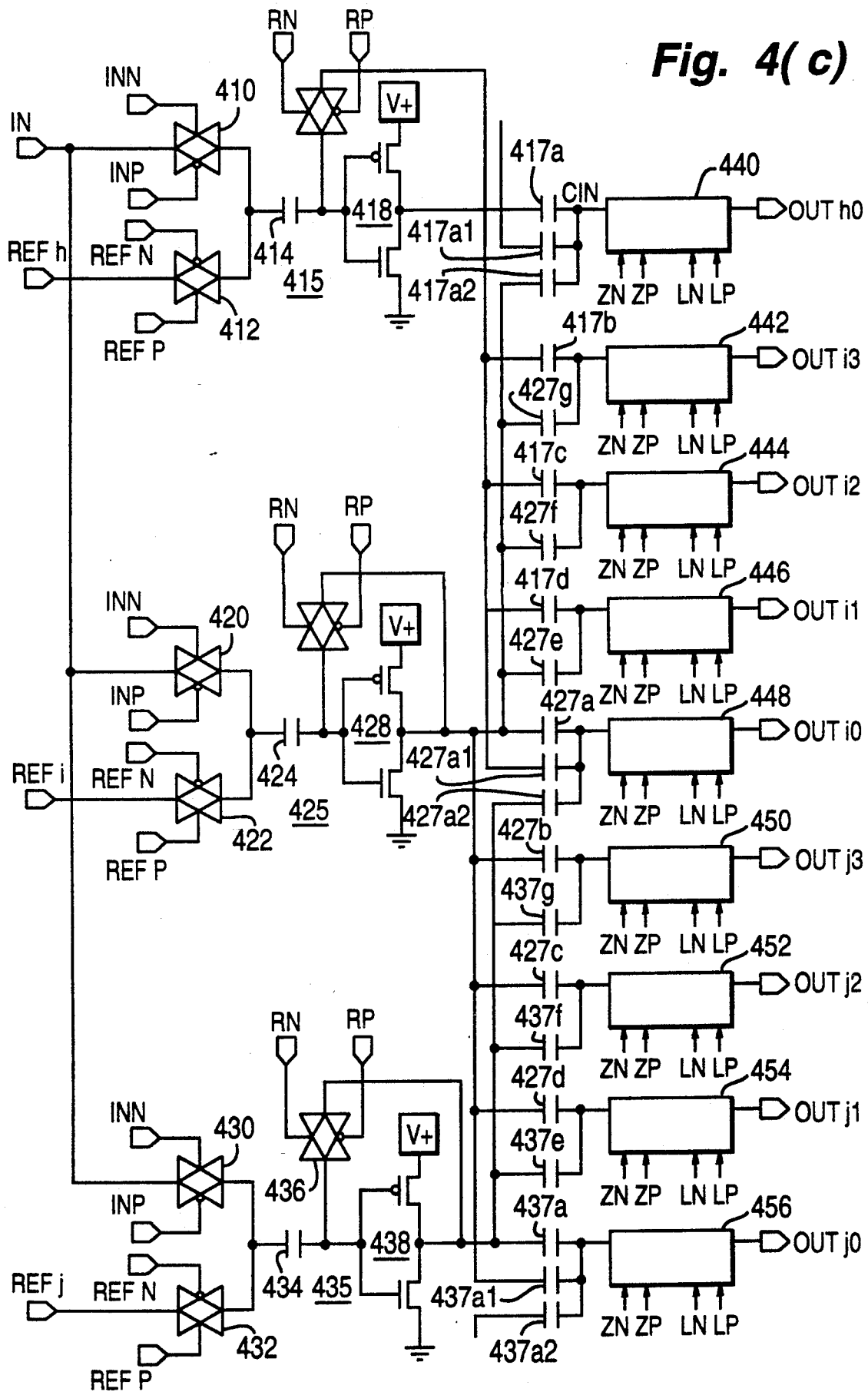
FIG. 4(c) is a schematic diagram of an alternate configuration for use in the ADC shown of FIG. 2.

FIG. 4(c) is an alternative embodiment to FIG. 4 where charge from adjacent real comparators is averaged. For example, charge on output capacitor 427a is averaged with charge from next higher and next lower real comparators, using additional capacitors 427a1 and 427a2 would be one-half the size of 427a. Similarly for the adjacent real comparators additional capacitors 417a1 and 417a2 and additional capacitors 437a1 and 437a2, respectively, are used for charge redistribution. The output of all the real comparators is thus the weighted average of three adjacent real comparators. If all three, adjacent comparators are ideal, the averaged output is unchanged. If the three adjacent comparators are not ideal, averaging of charge between the three adjacent real comparators typically reduces worst case error for any real comparator output by a factor of 2, further enhancing both differential and integral linearity. Typically, averaging of all real comparators is performed (except for the top-most and bottom-most comparator for which no extra adjacent comparator exists).

Figure 5:
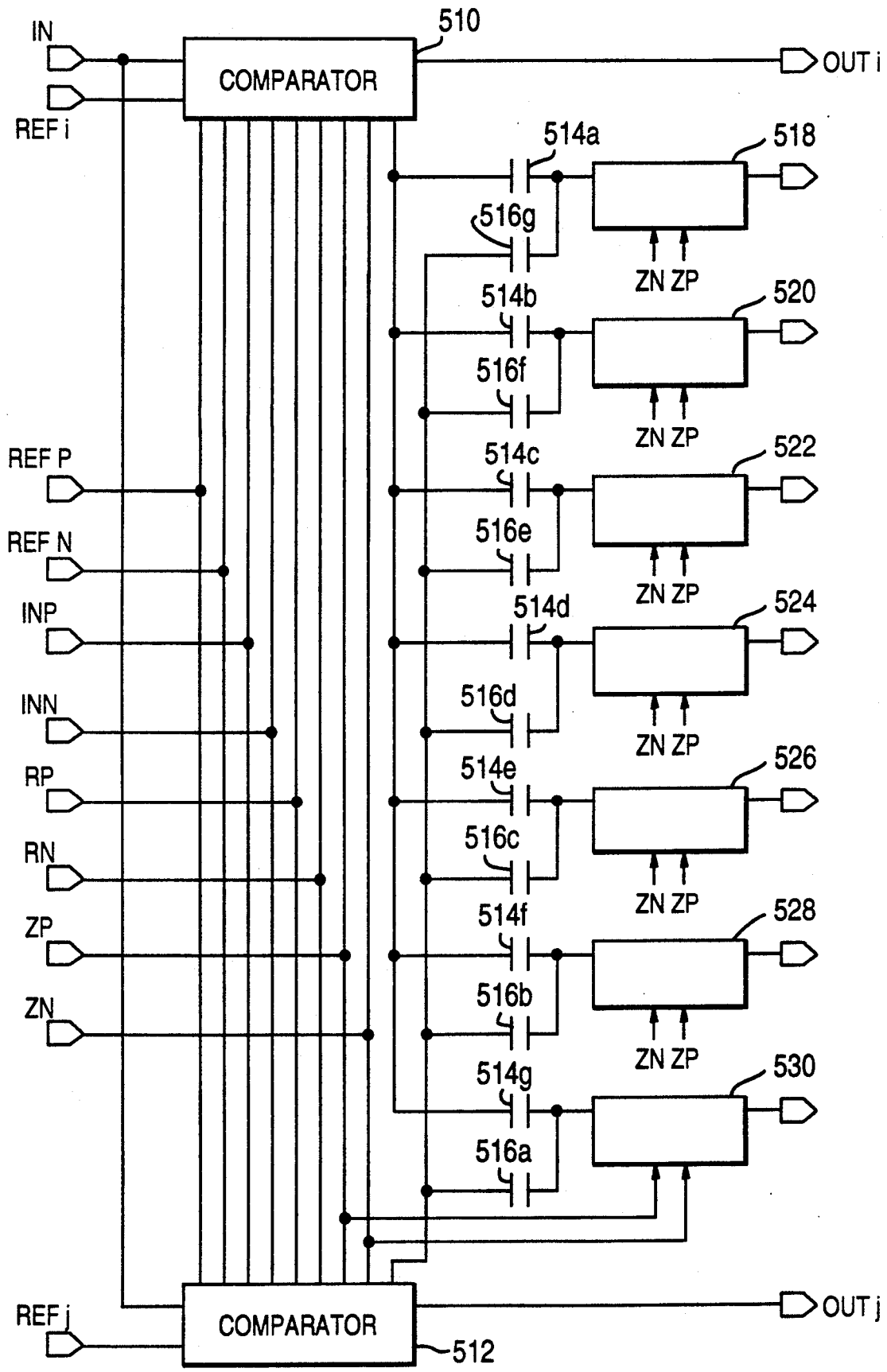
FIG. 5 is a block diagram illustrating an alternative ADC based on the circuitry of FIGS. 4 and 4(a).

FIG. 5 is a block diagram showing an extension of the ADC of FIGS. 4 and 4(a). In this ADC, there are seven pseudocomparators 518, 526, 522, 524, 526, 528 and 530 between each two actual comparators 510 and 512. The output signal provided by each actual comparator is distributed to fifteen capacitors. One-eighth of the output signal is applied to the capacitor of the actual comparator and one-sixty-fourth of the output signal is applied to each of the two capacitors which are farthest from the actual comparator. In FIG. 5, the capacitor of comparator 512 (not shown) would receive one-eighth of the charge while capacitors 516a to 516g would receive respectively seven-sixty-fourths, three-thirty-seconds, five-sixty-fourths, one-sixteenth, three-sixty-fourths, one-thirty-second, and one-sixty-fourth of the charge provided by the comparator amplifier 512.

The output signal of the comparator 510 would be distributed in the same manner among the capacitors 514a to 514g. In this configuration, the output signals provided by the pseudocomparators 518 to 530 represent eight weighted average values of the relative differences between the input signal IN and the reference signals REFj and REFk. This circuit has advantages over the circuit of FIG. 4 and 4(a) since, to produce an eight-bit digital output signal, only thirty-two comparators would be coupled to the input signal and to the reference ladder as opposed to sixty-four for the circuit in FIG. 4.

Figure 6:
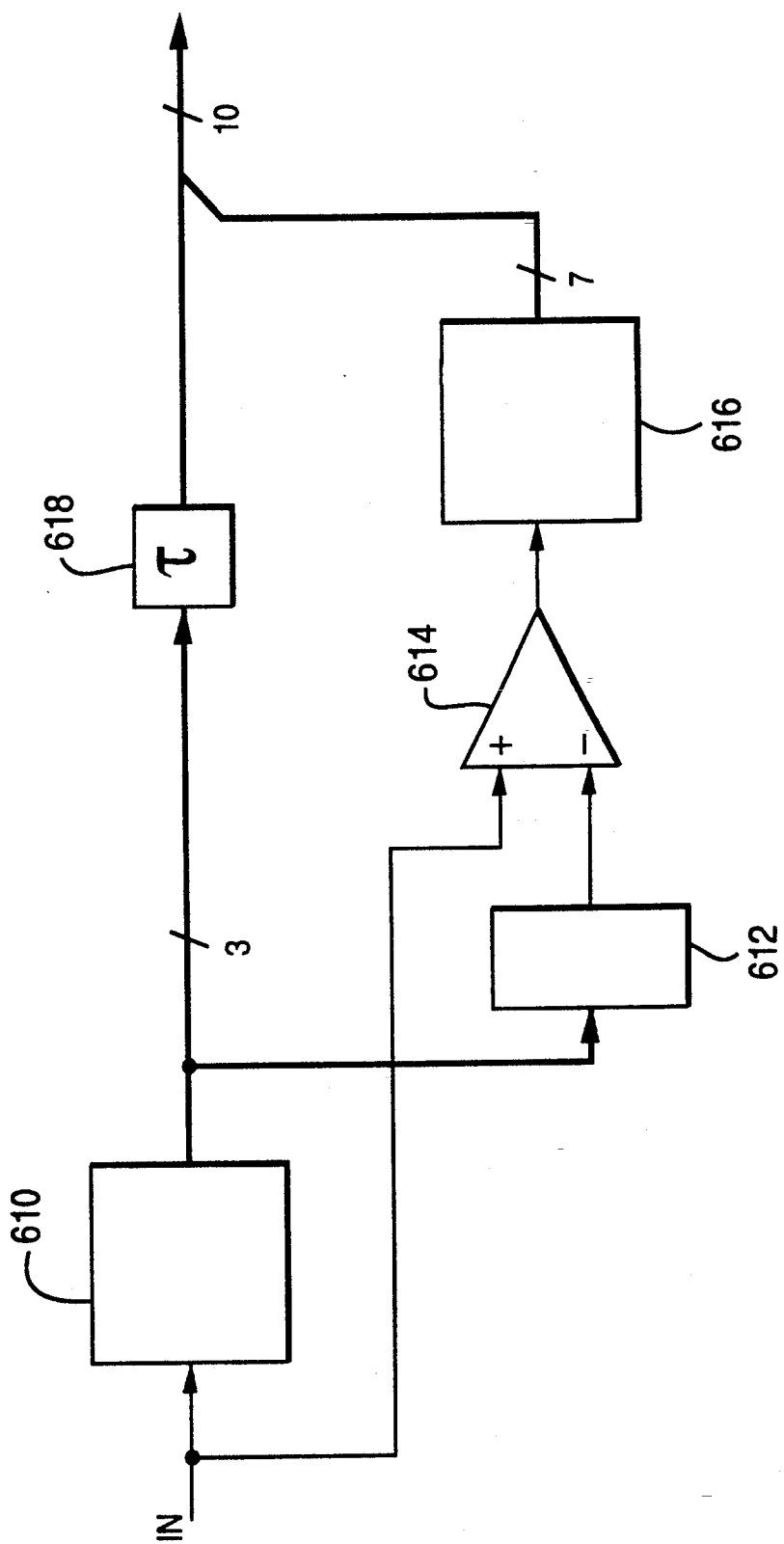
FIG. 6 is a block diagram illustrating a sub-ranging ADC including two ADCs of the invention.

FIG. 6 is a block diagram of a sub-ranging ADC that can be used to further reduce the number of comparators which are coupled to receive the input signal. In FIG. 6, the input signal IN is applied to a four-bit ADC 610. The three most significant bits (MSBs) of the signal provided by this ADC are applied to a digital-to-analog converter (DAC) 612 and to a delay element 618.

The output signal of the DAC is applied to a subtracter 614 which may be, for example, a precision differential amplifier. This amplifier subtracts the analog output signal provided by the DAC 612 from the input signal IN. The output signal of the subtracter 614 is applied to a seven-bit ADC 616. The seven-bit output signal of this ADC is concatenated, as the seven least significant bits (LSBs) with the three-bit output signal provided by the delay element 618 as the three MSBs to provide a ten-bit digital output signal. The ADC of FIG. 6 thus produces a ten-bit output signal using only thirty-six actual comparators and one hundred and eight pseudocomparators. A conventional flash ADC would use 1023 comparators coupled to the input signal to produce the same result.

An ADC of the type of FIG. 6 would greatly reduce the input loading and power requirements of a high speed ten-bit ADC compared with either a conventional flash-type ADC or a single stage averaging type ADC as shown in FIGS. 2, 3, 4 and 5.

While the invention has been described in terms of a set of exemplary embodiments, it is contemplated that it may be practiced as outlined above within the spirit and scope of the appended claims.

We claim:

1. An analog-to-digital converter comprising:
   reference means for generating first and second predetermined reference values;
   first actual comparator means, coupled to the input terminal and to the reference means, for generating a first difference signal representing the difference between an analog input signal and only the first reference value;
   second actual comparator means, coupled to the input terminal and to the reference means, for generating a second difference signal representing the difference between the input signal and only the second reference value;
   dividing means for dividing the first and second difference signals in a predetermined proportion to produce first and second proportioned difference signals;
   pseudocomparator means, coupled to the dividing means, for combining the first and second proportioned difference signals to generate a comparison signal, said pseudocomparator means including a complementary metal oxide semiconductor (CMOS) latch for storing the comparison signal; and
   decoder means, coupled to receive the first and second difference signals and the stored comparison signal, for generating a digital output signal representing the input signal.

2. The converter of claim 1 wherein:
   the dividing means includes means for dividing the first and second difference signals in a further predetermined proportion to produce third and fourth proportioned difference signals;
   and the converter further comprises:
   further pseudocomparator means, for combining the third and fourth proportioned difference signals to generate a further comparison signal and for storing the further comparison signal;
   wherein the decoder means is coupled to receive the stored further comparison signal to generate the digital output signal.

3. The converter of claim wherein:
   each of the first and second actual comparator means includes a bipolar differential amplifier having first and second output terminals at which the amplifier provides the first difference signal; and
   the dividing means includes:
   first and second resistor networks coupled between the respective first and second output terminals of the first and second actual comparator means, wherein the first and second resistor networks combine the difference signals provided at the respective first and second output terminals of the first and second actual comparator means to generate the first and second proportioned difference signals; and
   each of the pseudocomparators includes:
   CMOS latching amplifier means, coupled to the first and second resistor networks for combining the first and second proportioned difference signals provided by the first and second resistor networks to produce the comparison signal and to store the comparison signal.

4. The converter of claim 3 further comprising:
   third actual comparator means coupled to the input terminal, the reference means and to the first and second resistor networks for generating a further difference signal;
   wherein the first and second resistor networks act to average the first and second difference signals and the further difference signal.

5. The converter of claim 1 wherein:
   the first actual comparator means includes a first amplifier which develops the first difference signal representing the difference between the input signal and the first reference value;
   the second actual comparator means includes a second amplifier which develops the second difference signal representing the difference between the input signal and the second reference value; and
   the dividing means includes:
   first signal dividing means for dividing the first difference signal into at least first and second parts;
   second signal dividing means for dividing the second difference signal into at least first and second parts; and
   the pseudocomparator means includes means for summing the second parts of the respective first and second difference signals as the respective first and second proportioned difference signals to generate the comparison signal.

6. An analog-to-digital converter comprising:
   reference means for generating first and second predetermined reference values;
   first actual comparator means, coupled to the input terminal and to the reference means, including a first amplifier which generates a first difference signal, being a sequence of electrical charge samples which represent the difference between an analog input signal and only the first reference value at respective instants;
   second actual comparator means, coupled to the input terminal and to the reference means and including a second amplifier which generates a second difference signal, being a sequence of electrical charge samples which represent the difference between the input signal and only the second reference value at the respective instants;
   pseudocomparator means, including:
   first signal dividing means for dividing the first difference signal into at least first and second parts in a first predetermined proportion;
   second signal dividing means for dividing the second difference signal into at least first and second parts in a second predetermined proportion;

wherein the first and second signal dividing means include means for dividing an electric charge sample into a plurality of subsamples; and means for summing the second parts of the respective first and second difference signals to generate a comparison signal; and decoder means, coupled to receive the first and second difference signals and the comparison signal, for generating a digital output signal representing the input signal.

7. The converter of claim 6 wherein the first and second signal dividing means includes first and second sets of transistors, each set having interconnected gates, wherein the individual transistors in each set have respective widths in a predetermined proportion.

8. The converter of claim 6 wherein the first and second signal dividing means includes first and second sets of capacitors coupled in parallel, wherein the individual capacitors in each set are fabricated to have respective capacitances in a predetermined proportion.

9. The converter of claim 8 further comprising means for averaging charge between one of the actual comparators and the two adjacent actual comparators.

10. An analog-to-digital converter for generating an n-bit digital output signal representing an analog input signal, where n is an integer, the analog-to-digital converter comprising:

reference means for generating $2^{n-m}$ respectively different reference values, where m is an integer greater than 1 and less than n;

$2^{n-m}$ actual comparators coupled to receive the analog input signal and respectively different successive ones of the $2^{n-m}$ reference values to provide $2^{n-m}$ respective difference signals representing the differences between the input signal and each of the successive $2^{n-m}$ reference values;

$2^{n-m}-1$ groups of pseudocomparators, each group coupled between a respectively different adjacent pair of the $2^{n-m}$ actual comparators, each of the $2^{n-m}-1$ groups of pseudocomparators including, $2^m-1$ pseudocomparator means, responsive to the difference signals provided by the respective pair of actual comparator means, for generating $2^m-1$ pseudocomparator output signals representing respective differences between the input signal and $2^m-1$ pseudoreference values which are evenly spaced between the respective reference values applied to the respective pair of actual comparators;

complementary metal oxide semiconductor (CMOS) latching means, coupled to the actual comparators and to the pseudocomparators for storing the respective difference signals and output signals provided thereby;

decoder means, responsive to the $2^{n-m}$ stored difference signals and to the stored output signals of the $2^{n-m}-1$ groups of pseudocomparators for generating the n-bit digital output signal.

11. The converter of claim 10 further comprising:
first signal dividing means for dividing the first difference signal into $2^m$ parts having respectively different amplitudes which are in a predetermined proportional relationship;

second signal dividing means for dividing the second difference signal into $2^m$ parts having respectively different amplitudes which are in the predetermined proportional relationship; and means for coupling $2^m-1$ successive ones of the parts of the first difference signal and $2^m-1$ successive ones of the parts of the second difference signal to respectively different ones of the $2^m-1$ pseudocomparator means.

12. The converter of claim 11 wherein n is 8 and m is 2 and the first and second signal dividing means divide the respective first and second difference signal into 4 parts having the predetermined proportional relationship of 4:3:2:1.

13. The converter of claim 12 wherein the 3 pseudocomparator means combine the respective signals provided by the first and second dividing means in respective proportions of 1:3, 2:2 and 3:1.

14. The converter of claim 11 wherein n is 10 and m is 3 and the first and second signal dividing means divide the respective first and second difference signal into 8 parts having the predetermined proportional relationship of 8:7:6:5:4:3:2:1.

15. A sub-ranging analog-to-digital converter (ADC) which generates an (n+p-1)-bit digital output signal from an analog input signal where n and p are integers greater than 2, the analog-to-digital converter comprising:

a first ADC which generates an n-bit digital output signal including:

$2^{n-m}$ actual comparator means, coupled to the input signal and to respective $2^{n-m}$ reference signals for generating $2^{n-m}$ difference signals representing respective differences between the input signal and each of the $2^{n-m}$ reference signals, where m is an integer less than n and greater than 1;

dividing means for dividing respective adjacent ones of the difference signals in a predetermined proportion to produce $2^{n-m}-1$ sets of $2^m-1$ proportioned difference signals each set representing respective differences between the input signal and respective $2^m-1$ pseudoreference signals evenly spaced between the respective reference signals applied to the respective pair of actual comparator means;

$2^{n-m}-1$ groups of pseudocomparators, each group coupled between a respectively different adjacent pair of the $2^{n-m}$ actual comparator means, each group including, $2^m-1$ pseudocomparator means, for combining respective adjacent ones of the $2^m-1$ proportioned difference signals to generate respective comparison signals; and complementary metal oxide semiconductor (CMOS) latching means, coupled to the actual comparator means and to the pseudocomparators for storing the respective difference signals and output signals provided thereby;

decoder means for generating the n-bit digital output signal from the stored difference signals and the stored comparison signals provided by the CMOS latching means;

digital-to-analog conversion means, coupled to the first ADC for generating an analog output signal representing the n-1 most significant bits of the n-bit digital output signal;

subtraction means, coupled to the digital-to-analog conversion means for subtracting the analog output signal provided thereby from the input signal to generate a sub-range input signal;

a second ADC which generates a p-bit digital output signal including:

$2^{p-q}$ sub-range actual comparator means, coupled to the sub-range input signal and to respective $2^{p-q}$ reference signals for generating $2^{p-q}$ difference signals representing respective differences between the sub-range input signal and each of the $2^{p-q}$ reference signals, where q is an integer less than p and greater than 1;

sub-range dividing means for dividing respective adjacent ones of the $2^{p-q}$ difference signals in a predetermined proportion to produce $2^{p-q}-1$ sets of $2^q-1$ sub-range proportioned difference signals each set representing respective differences between the sub-range input signal and respective sub-range pseudoreference signals evenly spaced between the respective sub-range reference signals applied to the respective pair of sub-range actual comparator means;

$2^{p-q}-1$ groups of sub-range pseudocomparators, each group of sub-range pseudocomparators coupled between a respectively different adjacent pair of the $2^{p-q}$ actual sub-range comparator means, each of the $2^{p-q}-1$ groups of sub-range pseudocomparators including, $2^q-1$ sub-range pseudocomparator means, for combining respective adjacent ones of the sub-range proportioned difference signals to generate respective sub-range comparison signals; and sub-range complementary metal oxide semiconductor (CMOS) latching means, coupled to the sub-range actual comparator means and to the sub-range pseudocomparators for storing the respective difference signals and output signals provided thereby;

decoder means for generating the p-bit digital output signal from the difference signals provided by the and the sub-range comparison signals provided by the sub-range CMOS latching means; and means for combining the n−1 most significant bits of the n-bit digital output signal produced by the first ADC with the p-bit digital output signal produced by the second ADC to produce the (n+p−1)-bit digital output signal.

16. An analog-to-digital converter comprising:
means for providing a plurality of reference signals;
a plurality of actual comparator means each for comparing an input signal with a single respective one of the reference signals to produce an output signal representing the difference between the input signal and the one reference signal;

dividing means, coupled between each pair of actual comparator means for dividing the difference signals provided thereby into respective portions;

a plurality of pseudocomparators, coupled between each pair of the actual comparator means, each of the pseudocomparators having, as inputs, a respectively different one of the portions of the each of the output signals provided by the dividing means and having output signals which are intermediate between the output signals of the pair of actual comparators, wherein each pseudocomparator includes a complementary metal oxide semiconductor (CMOS) latch for storing the output signal of the pseudocomparator; and decoding means, connected to receive the output signals of the actual comparators and the stored output signals of the pseudocomparators, for generating a digital signal representing the input signal.

17. An analog-to-digital converter comprising:
reference means for generating first and second predetermined reference values;

first actual comparator means, coupled to the input terminal and to the reference means, for generating a first sequence of electrical charge samples representing the difference between an analog input signal and only the first reference value at a plurality of respectively different instants;

second actual comparator means, coupled to the input terminal and to the reference means, for generating a second sequence of electrical charge samples representing the difference between the input signal and only the second reference value at said plurality of instants;

pseudocomparator means, for combining respective samples from the first and second sequences of electrical charge in a predetermined proportion to generate a third sequence of electrical charge samples, wherein each pseudocomparator includes a complementary metal oxide semiconductor (CMOS) latch for storing the output signal of the pseudocomparator; and decoder means, coupled to receive the first, second and third sequences of electrical charge samples for generating a digital output signal representing the input signal.

* * * * *